(12) United States Patent
Chen et al.

(10) Patent No.: US 8,427,228 B2
(45) Date of Patent: Apr. 23, 2013

(54) SYSTEM INCLUDING ADAPTIVE POWER RAILS AND RELATED METHOD

(75) Inventors: Chun-Ying Chen, Irvine, CA (US); Jiangfeng Wu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 171 days.

(21) Appl. No.: 13/065,720

(22) Filed: Mar. 28, 2011

(65) Prior Publication Data

US 2012/0062311 A1    Mar. 15, 2012

Related U.S. Application Data

(60) Provisional application No. 61/403,186, filed on Sep. 9, 2010.

(51) Int. Cl.
  *G05F 1/10*    (2006.01)
(52) U.S. Cl.
  USPC ............................................. 327/535

(58) Field of Classification Search .................. 327/534, 327/535, 537, 540, 541
See application file for complete search history.

(56) References Cited

U.S. PATENT DOCUMENTS 3,866,064 A * 2/1975 Gregory et al. ............... 327/437
5,892,387 A * 4/1999 Shigehara et al. ............ 327/537

* cited by examiner

*Primary Examiner* — Jeffrey Zweizig
(74) *Attorney, Agent, or Firm* — Farjami & Farjami LLP

(57) ABSTRACT

According to one disclosed embodiment, an adaptive voltage rail circuit for integrating low voltage devices with high voltage analog circuits is described. This adaptive voltage rail circuit includes a high voltage analog circuit having a common mode voltage. Further included is a first voltage rail having a first rail voltage which is based on and greater than the common mode voltage of the high voltage analog circuit. A second voltage rail having a second rail voltage which is based on and less than the same common mode voltage is also present. By connecting these first and second voltage rails across at least one low voltage device, an adaptive voltage rail circuit is able to safely integrate low voltage devices with high voltage analog circuits in the same system.

20 Claims, 3 Drawing Sheets

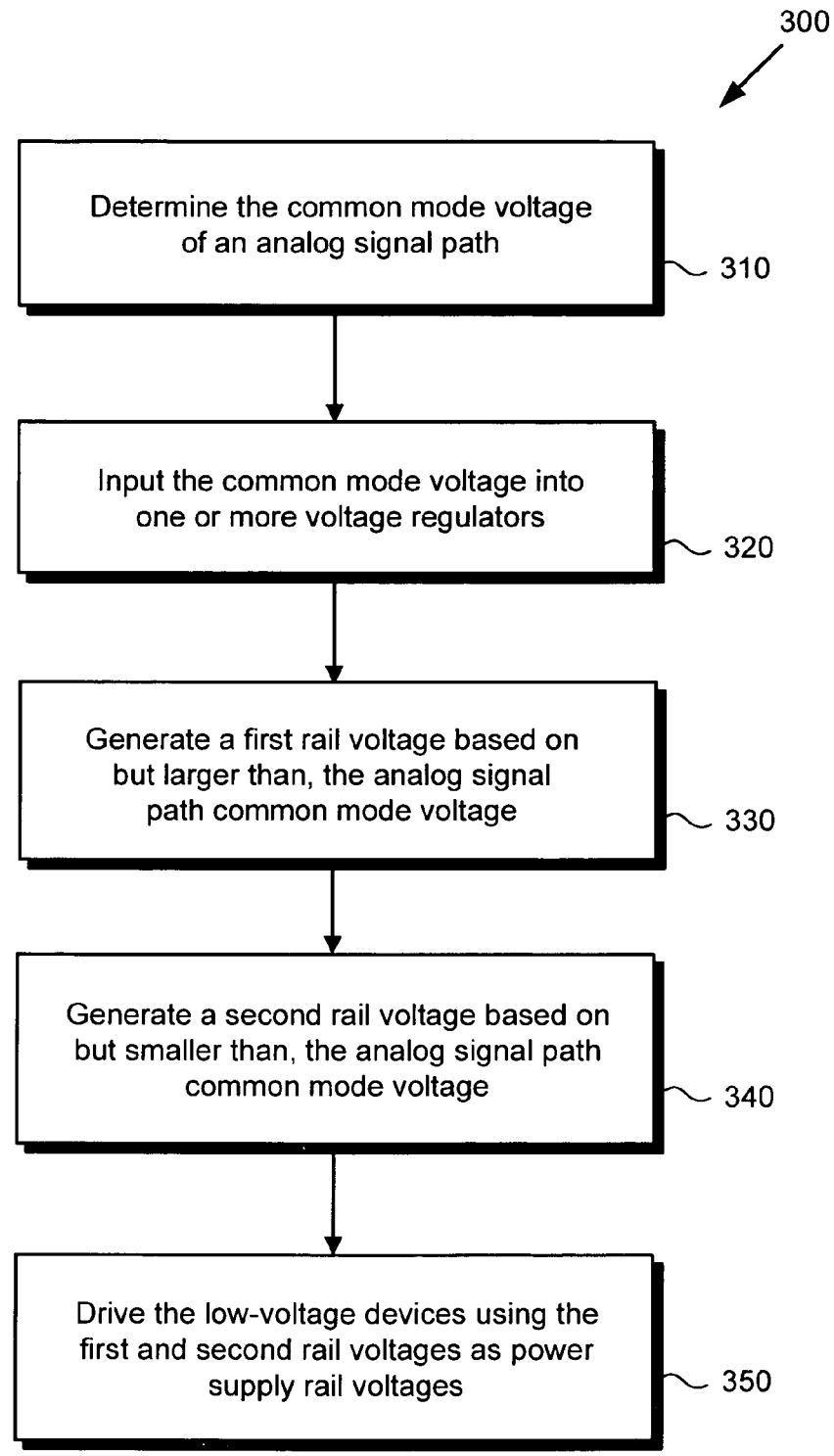

SYSTEM INCLUDING ADAPTIVE POWER RAILS AND RELATED METHOD

RELATED APPLICATIONS

This application is based on and claims priority from U.S. Provisional Patent Application Ser. No. 61/403,186, filed on Sep. 9, 2010, which is hereby incorporated by reference in its entirety.

BACKGROUND OF THE INVENTION

1. Field of the Invention

The present invention is generally in the field of electronic devices and systems. More particularly, the present invention is in the field of delivery of power to electronic devices and systems.

2. Background Art

In several applications in integrated circuit design, systems require a combination of analog circuits and digital switching devices. Large input signal amplitude in analog circuit design is desired because it maximizes the signal-to-noise ratio (SNR) and reduces the power consumption. For this purpose a high supply voltage is required for the circuit to accommodate the high input signal. However, when using the high supply voltage in the whole system one of the major drawbacks is that the CMOS logic has to operate at high supply voltage as well.

High-voltage-tolerance CMOS devices have a high breakdown voltage but they also have slow switching characteristics. For example, in 65 nm or 40 nm standard CMOS technology, there are two types of CMOS devices: thick-gate-oxide devices with high supply tolerance of 2.5V and thin-gate-oxide devices with a supply voltage tolerance of 1V. While the thick-gate device has a higher voltage tolerance the switching speed is 10 times slower than that of thin-gate devices. Thus there is a trade-off in speed and SNR when choosing thick-gate or thin-gate devices for the system.

Thus, there is a need to overcome the drawbacks and deficiencies in the art by providing an integrated solution which allows a high supply voltage for analog circuits such as amplifiers to achieve good SNR, while allowing for the use of low voltage devices, such as fast thin-gate-oxide devices for CMOS switching circuits.

SUMMARY OF THE INVENTION

The present invention is directed to a system including adaptive power rails and a related method, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein:

FIG. 3 shows a flowchart illustrating steps taken to implement a method for integrating low voltage thin-gate-oxide devices with high voltage analog circuits, according to an embodiment of the present invention.

DETAILED DESCRIPTION OF THE INVENTION

Figure 1:
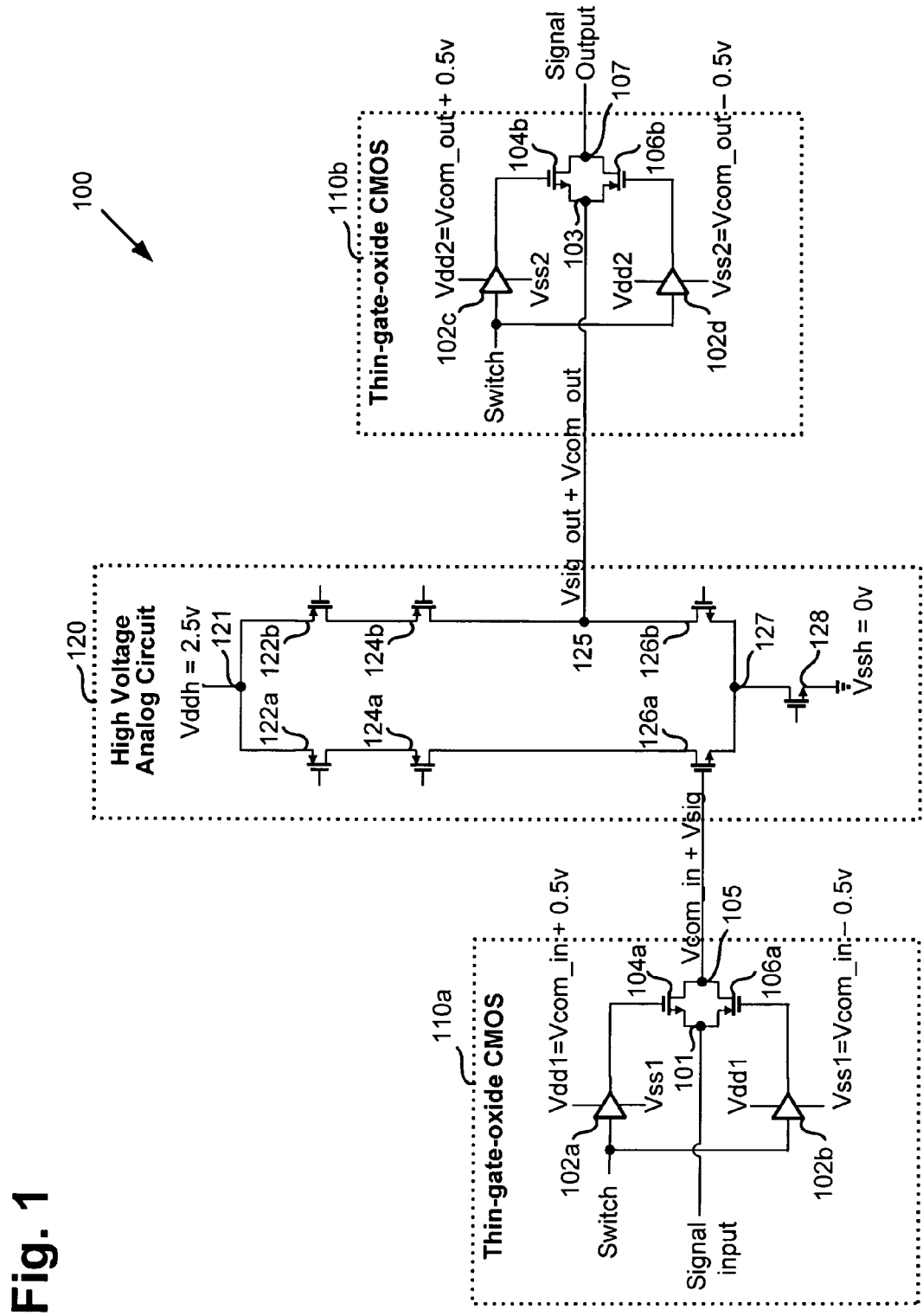
FIG. 1 illustrates a schematic diagram of a system including adaptive power rails for integrating low voltage thin-gate-oxide devices with high voltage analog circuits, according to one embodiment of the present invention.

The present invention is directed to a system including adaptive power rails for integrating low voltage devices, such as thin-gate-oxide devices, with high voltage analog circuits and a related method. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

As is known by those of ordinary skill in the art, a common mode voltage is a signal or bias voltage that appears on all compared lines or reference points, in-phase and with equal amplitudes. Technically, a common-mode voltage is one-half the vector sum of the voltages from each conductor of a balanced circuit to local ground or common. Such signals can arise from one or more of the following sources: radiated signals coupled equally to both lines or reference points, an offset from signal common created in the driver circuit, or a ground differential between the transmitting and receiving locations. One or more embodiments of the present invention are directed toward a system including adaptive power rails for integrating low voltage devices, such as thin-gate-oxide devices, with high voltage analog circuits, using a common-mode voltage within the high voltage analog circuit as a reference point.

FIG. 1 illustrates a schematic diagram of a system including adaptive power rails for integrating low voltage thin-gate-oxide devices with high voltage analog circuits, according to one embodiment of the present invention. System 100, in FIG. 1, includes first thin-gate-oxide CMOS device 110a, second thin-gate-oxide CMOS device 110b and high voltage analog circuit 120. According to the embodiment shown in FIG. 1, system 100 is configured so that first thin-gate-oxide CMOS device 110a, second thin-gate-oxide CMOS device 110b, and high voltage analog circuit 120 may be integrated while being driven by different voltage rails.

As shown in FIG. 1, first thin-gate-oxide CMOS device 110a may comprise NMOS switch 104a and PMOS switch 106a, which have their source electrodes connected together at common source node 101 and their drain electrodes connected together at common drain node 105. A signal input is connected to common source node 101 and the output of first thin-gate-oxide CMOS device 110a is connected to common drain node 105. The output voltage of first thin-gate-oxide CMOS device 110a will consist of a common mode voltage, $V_{com\_in}$, which may vary from chip to chip due to process or power supply variation, plus a signal voltage, $V_{sig}$. To ensure that the thin gate oxide CMOS switches are not driven by a voltage outside their tolerance level, such as a 1V tolerance for example, switches 104a and 106a may be driven by buffers 102a and 102b, respectively. As shown in FIG. 1, in one embodiment, buffers 102a and 102b are each supplied by first and second adaptive rail voltages $V_{dd1}$ and $V_{ss1}$, which track the common mode voltage $V_{com\_in}$ such that $V_{dd1}$ is generated to have a value of $V_{com\_in}$+0.5V and $V_{ss1}$ is generated to have a value of $V_{com\_in}$−0.5V. An example of how this is accomplished will be discussed in more detail in conjunction with FIG. 3. In this manner, adaptive rail voltages $V_{dd1}$ and $V_{ss1}$ have a differential of 1V, centered around the common mode voltage $V_{com\_in}$. Thus low voltage, thin-oxide-gate CMOS switches 104a and 106a may be integrated with high voltage analog circuit 120 while maintaining a supply voltage within the 1V tolerance of the low voltage, thin-oxide-gate CMOS switches. In another embodiment, $V_{dd1}$ can have a value of $V_{com\_in}$+0.3V and $V_{ss1}$ can have a value of $V_{com\_in}$−0.7V, or alternatively, $V_{dd1}$ and $V_{ss1}$ can have any other values above and below $V_{com\_in}$, respectively, such that the difference between $V_{dd1}$ and $V_{ss1}$ is no greater than the tolerance of the low voltage, thin-oxide-gate CMOS switches.

Referring now to high voltage analog circuit 120, according to the embodiment shown in FIG. 1, $V_{com\_in}$+$V_{sig}$ is fed into high voltage analog circuit 120. High voltage analog circuit 120 may have a supply voltage of 2.5V, for example. High voltage analog circuit 120 may comprise PMOS switch 122a as a current source in series with PMOS switch 124a as a cascoded device and NMOS switch 126a as the differential pair. These 3 series switches are in a mirrored arrangement where they are paralleled with another series arrangement similarly comprising PMOS switch 122b, PMOS switch 124b and NMOS switch 126b. This may be accomplished, for example, by connecting the sources of PMOS switches 122a and 122b together at the supply voltage, e.g., at node 121, and connecting the sources of NMOS switches 126a and 126b together at common source node 127.

As further shown in FIG. 1, bias NMOS switch 128 of high voltage analog circuit 120 is connected between common source node 127 and ground. The $V_{com\_in}$+$V_{sig}$ signal is connected to and drives high voltage analog circuit 120 through connection to the gate of NMOS switch 126a. High voltage analog circuit 120 also has output node 125 located where the drain of PMOS switch 124b and the drain of NMOS switch 126b connect. Just as with the output voltage of first thin-gate-oxide CMOS device 110a, high voltage analog circuit 120 also has an output voltage which consists of a common mode voltage, $V_{com\_out}$, which may vary from chip to chip due to process or power supply variation of the high voltage analog circuit, plus an amplified signal voltage, $V_{sig\_out}$. Thus, the voltage output of high voltage analog circuit 120 will be $V_{com\_out}$+$V_{sig\_out}$.

According to the embodiment shown in FIG. 1, the output of high voltage analog circuit 120 is fed into second thin-gate-oxide CMOS device 110b. Similar to first thin-gate oxide CMOS device 110a, CMOS device 110b may comprise NMOS switch 104b and PMOS switch 106b, which have source electrodes connected together at a common source node 103 and drain electrodes connected together at a common drain node 107. The high voltage analog circuit output is connected to common source node 103 and the output of second thin-gate-oxide CMOS device 110b is connected to common drain node 107. As also shown in FIG. 1, the output voltage of second thin-gate-oxide CMOS device may comprise the signal output from system 100.

CMOS switches 104b and 106b of thin-gate-oxide CMOS device 110b may be driven by buffers 102c and 102d, respectively. Buffers 102c and 102d are shown as being supplied by third and fourth adaptive rail voltages $V_{dd2}$ and $V_{ss2}$ respectively, which track the common mode voltage $V_{com\_out}$ such that $V_{dd2}$ is generated to have a value of $V_{com\_out}$+0.5V and $V_{ss2}$ is generated to have a value of $V_{com\_out}$−0.5V. In this manner, rail supply voltages $V_{dd2}$ and $V_{ss2}$ also have a differential of 1V centered around the common mode voltage $V_{com\_out}$. In another embodiment, $V_{dd2}$ can have a value of $V_{com\_out}$+0.3V and $V_{ss2}$ can have a value of $V_{com\_out}$−0.7V, or alternatively, $V_{dd2}$ and $V_{ss2}$ can have any other values above and below $V_{com\_out}$, respectively, such that the difference between $V_{dd2}$ and $V_{ss2}$ is no greater than the tolerance of the low voltage, thin-oxide-gate CMOS switches.

Therefore, by providing an adaptive rail voltage system having the ability to integrating low voltage thin-gate-oxide devices with high voltage analog circuits, the present inventive concepts provide a circuit with a significant increase in flexibility, as well as a nearly ten fold increase in switching speed capability, while preserving superior signal to noise ratio due to high voltage supplies to the analog circuitry.

Figure 2:
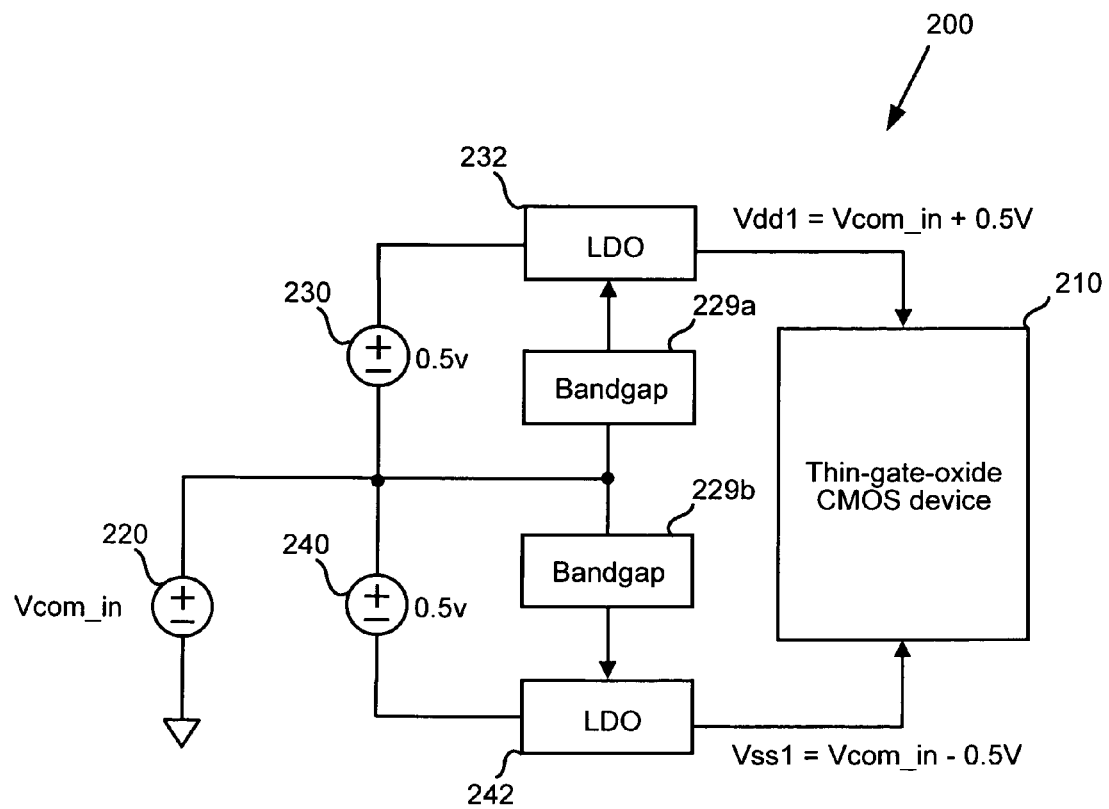
FIG. 2 illustrates a schematic diagram of adaptive power rails used to power low voltage thin-gate-oxide devices, according to an embodiment of the present invention.

FIG. 2 illustrates diagram 200 showing an example implementation of adaptive power rails which may be used for integrating low voltage thin-gate-oxide devices with high voltage analog circuits, according to one embodiment of the present invention. As was previously stated regarding system 100, in FIG. 1, thin-gate-oxide CMOS device 110a may have an output which may serve as an input to high voltage analog circuit 120 and may comprise, for example, a common mode voltage $V_{com\_in}$ and a signal voltage $V_{sig}$. Once a common mode voltage $V_{com\_in}$ has been determined, it may be used to determine which adaptive rail voltages may be generated and which may in turn be used to safely drive a low voltage thin-gate-oxide CMOS device within its tolerance range.

As shown in FIG. 2, in one embodiment of the present invention, an adaptive power rail system may include a high voltage analog circuit having a common-mode voltage, which may be modeled as a voltage source 220 having a voltage $V_{com\_in}$. A first voltage rail having a first rail voltage, based on the common mode voltage $V_{com\_in}$, and greater than the common mode voltage, may be created by connecting a first voltage regulator 230, modeled as a voltage source, between the high voltage analog circuit, modeled by common mode voltage source 220, and the first voltage rail. Thus, the first voltage rail outputs a first rail voltage 0.5V greater than the common mode voltage, for example, $V_{com\_in}$+0.5V. The first rail voltage may be further stabilized by feeding it into, for example, a first low-dropout regulator (LDO) 232. First LDO 232 can operate with a very small input-output differential voltage to provide an accurate, stabilized rail voltage, $V_{dd1}$. This accurate, stabilized voltage may be created by inputing the common mode voltage to, for example, a first bandgap circuit 229a which creates a reference voltage that may be input to the first LDO 232, thus allowing the first LDO 232 to accurately stabilize the first rail voltage.

In order to create a second voltage rail having a second rail voltage, based on the common mode voltage $V_{com\_in}$, and less than the common mode voltage, a second voltage regulator 240, modeled by another voltage source, may be connected between the high voltage analog circuit, modeled by common mode voltage source 220, and the second voltage rail. Thus, the second voltage rail outputs a second rail voltage 0.5V less than the common mode voltage, for example, $V_{com\_in}$−0.5V. The second rail voltage may be further stabilized by feeding it into, for example, second LDO 242. Second LDO 242 can provide an accurate, stabilized rail voltage, $V_{ss1}$. This accurate, stabilized voltage may be created by inputing the common mode voltage to, for example, a second bandgap circuit 229b which creates a reference voltage that may be input to the second LDO 242, thus allowing LDO 242 to accurately stabilize the second rail voltage.

Thus, first and second regulators 230 and 240 may output first and second adaptive rail voltages from the same common mode input, wherein the first and second rail voltages are centered around the common mode voltage and wherein the first rail voltage is 1V higher than the second rail voltage. At least one low voltage thin-gate-oxide device, for example, thin-gate-oxide CMOS device 210 corresponding to either of thin-gate-oxide devices 110a and 110b in FIG. 1, is then connected to these first and second voltage rails. A person of ordinary skill in the art would appreciate that this embodiment of the present invention may also be used to generate, for example, third and fourth rail voltages $V_{dd2}$ and $V_{ss2}$, based on a common mode voltage $V_{com\_out}$, for example, as described with regard to FIG. 1. A person of ordinary skill in the art would also appreciate that this embodiment may be disposed on a single semiconductor die, or alternatively, be disposed on separate dice, or circuit boards, for example.

FIG. 3 shows flowchart 300 illustrating steps taken to implement a method for integrating low voltage thin-gate-oxide devices with high voltage analog circuits, according to one embodiment of the present invention. Certain details and features have been left out of flowchart 300 that are apparent to a person of ordinary skill in the art. For example, a step may comprise one or more substeps or may involve specialized equipment or materials, as known in the art. While steps 310 through 350 indicated in flowchart 300 are sufficient to describe one embodiment of the present method, other embodiments may utilize steps different from those shown in flowchart 300, or may include more, or fewer steps.

Referring to step 310 of flowchart 300 in conjunction with FIG. 1, step 310 comprises determining a common mode voltage of a high voltage analog circuit signal path at a reference node of the high voltage analog circuit, e.g., high voltage analog circuit 120. This may be accomplished by any convenient means known to a person of ordinary skill in the art. Depending on the location of the low voltage thin-gate-oxide device or devices 110a and/or 110b in relation to high voltage analog circuit 120, this reference node may comprise, for example, an input node of high voltage analog circuit 120, an output node of high voltage analog circuit 120, or any other suitable node of high voltage analog circuit 120.

Continuing with step 320 in FIG. 3 and referring to FIG. 2, step 320 of flowchart 300 comprises inputting the common mode voltage determined in step 210 into one or more voltage regulators. Any type of suitable voltage regulator may be used and may include, for example, band gap circuits 229a and 229b and/or LDOs 232 and 242.

Moving on to step 330 in Figure, step 330 comprises generating a first rail voltage based on the common mode voltage, this first rail voltage being greater than the common mode voltage on which it is based. Step 340 may then include generating a second rail voltage, also based on the same common mode voltage, this second rail voltage being less than the common mode voltage on which it is based.

Continuing with step 350 of FIG. 3, step 350 of flowchart 300 comprises driving at least one low voltage thin-gate-oxide device using the first and second rail voltages. This may also include, for example, driving at least one other low voltage thin-gate-oxide device using a third and fourth rail voltage. For instance, referring to FIG. 1, first and second rail voltages based on a common mode voltage of high voltage analog circuit 120, e.g., $V_{com\_in}$+0.5V and $V_{com\_in}$−0.5V based on $V_{com\_in}$, are used to drive first thin-gate-oxide CMOS device 110a, while third and fourth rail voltages based on a common mode voltage of high voltage analog circuit 120, e.g., $V_{com\_out}$+0.5V and $V_{com\_out}$−0.5V based on $V_{com\_out}$, are used to drive second thin-gate-oxide CMOS device 110a. The ability to implement any lower voltage thin-gate-oxide devices and a high voltage analog circuit on a single semiconductor die, or alternatively on separate circuit boards may be seen to be enabled by implementation of the present inventive concepts.

Furthermore, with respect to generation of first and second rail voltages, those first and second rail voltage may have any relationship to a respective common mode voltage, so long as a first rail voltage is greater than and a second voltage is less than the respective common mode voltage. However, as shown by FIGS. 1 and 2, at least one embodiment of method 300 may include generating first and second rail voltages such that a common mode voltage is midway between the first and second rail voltages. The method 300 may also allow for a voltage differential between first and second rail voltages to be adjusted to any suitable voltage level, however, and again as represented in FIGS. 1 and 2, the present method may result in adjustment of a first rail voltage to be 1V higher than a second rail voltage, for example. In this case, a first rail voltage may be adjusted to be 0.5V higher than a common mode voltage and a second rail voltage may be adjusted to be 0.5V lower than a common mode voltage.

Thus, the various embodiments of the present invention provide a solution allowing the use of a high supply voltage for analog circuits, such as amplifiers, to achieve good signal to noise ratios, while using lower tolerance, fast, thin-gate-oxide devices for CMOS switching circuits offering greater flexibility in circuit design as well as a tenfold increase in CMOS switching speeds compared with the use of higher tolerance, thick-gate-oxide CMOS switches.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

What is claimed is:

1. A circuit for integrating low voltage devices with high voltage analog circuits, comprising:
   a high voltage analog circuit having a common mode voltage;
   a first voltage rail having a first rail voltage based on the common mode voltage, the first rail voltage greater than the common mode voltage;
   a second voltage rail having a second rail voltage based on the common mode voltage, the second rail voltage less than the common mode voltage; and
   at least one low voltage device connected to the first and second voltage rails.

2. The circuit of claim 1, further comprising:
   a first voltage regulator connected between the high voltage analog circuit and the first voltage rail; and
   a second voltage regulator connected between the high voltage analog circuit and the second voltage rail.

3. The circuit of claim 2, wherein the first and second voltage regulators include low-dropout regulators.

4. The circuit of claim 1, wherein the entire circuit is disposed on a single semiconductor die.

5. The circuit of claim 1, wherein the common mode voltage is input to first and second voltage regulators and the first and second rail voltages are output from the first and second voltage regulators respectively.

6. The circuit of claim 1, wherein the first and second rail voltages are centered around the common mode voltage.

7. The circuit of claim 1, wherein the first rail voltage is higher than the second rail voltage by a value no greater than the tolerance of the at least one low voltage device.

8. The circuit of claim 1, wherein the first voltage rail outputs the first rail voltage being a first amount of voltage greater than the common mode voltage and the second voltage rail outputs the second rail voltage being a second amount of voltage less than the common mode voltage, where the first amount of voltage plus the second amount of voltage is less than or equal to the tolerance of the at least one low voltage device.

9. The circuit of claim 2, wherein the common mode voltage is input to first and second bandgap circuits and the first and second rail voltages are stabilized using a reference voltage from the first and second bandgap circuits respectively.

10. A method for integrating low voltage devices with a high voltage analog circuit, the method comprising:
    determining a common mode voltage of an analog circuit signal path at a reference node of the high voltage analog circuit;
    generating a first rail voltage based on the common mode voltage, the first rail voltage greater than the common mode voltage;
    generating a second rail voltage based on the common mode voltage, the second rail voltage less than the common mode voltage;
    driving at least one low voltage device using the first and second rail voltages.

11. The method of claim 10, wherein the reference node comprises an output node of the high voltage analog circuit.

12. The method of claim 10, wherein the reference node comprises an input node of the high voltage analog circuit.

13. The method of claim 10, further comprising generating the first and second rail voltages such that the common mode voltage is midway between the first and second rail voltages.

14. The method of claim 10, further comprising adjusting the first rail voltage to be 1V higher than the second rail voltage.

15. The method of claim 10, further comprising adjusting the first rail voltage to be 0.5V higher than the common mode voltage and adjusting the second rail voltage to be 0.5V lower than the common mode voltage.

16. The method of claim 10, further comprising inputting the common mode voltage into first and second voltage regulators and outputting stabilized first and second rail voltages.

17. The method of claim 10, further comprising generating at least third and fourth rail voltages based on another common mode voltage determined at another reference node of the high voltage analog circuit.

18. The method of claim 17, further comprising driving at least one other low voltage device using the third and fourth rail voltages.

19. The method of claim 17, further comprising inputting the another common mode voltage into third and fourth voltage regulators and outputting stabilized third and fourth rail voltages to the third and fourth voltage rails, respectively.

20. The method of claim 10, wherein the low voltage devices and the high voltage analog circuit are implemented on a single semiconductor die.

* * * * *